(12) United States Patent
Kim et al.

(10) Patent No.: US 7,095,992 B2
(45) Date of Patent: Aug. 22, 2006

(54) PHASE LOCKED LOOP CALIBRATION

(75) Inventors: Hea Joung Kim, Los Angeles, CA (US); Brima B. Ibrahim, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 380 days.

(21) Appl. No.: 10/742,489

(22) Filed: Dec. 19, 2003

(65) Prior Publication Data

US 2005/0136873 A1    Jun. 23, 2005

(51) Int. Cl.
*H04B 1/18* (2006.01)
*H04B 17/00* (2006.01)
*H04B 1/40* (2006.01)

(52) U.S. Cl. ............... 455/180.3; 455/260; 455/226.1; 455/67.11; 455/76

(58) Field of Classification Search ............. 455/180.3, 455/260, 67.11, 76, 115.1, 115.2, 226.1; 327/156, 327/157, 147, 148
See application file for complete search history.

(56) References Cited

U.S. PATENT DOCUMENTS 6,157,271 A * 12/2000 Black et al. ................ 455/260
6,741,846 B1 * 5/2004 Welland et al. ............. 455/260
2002/0132598 A1 * 9/2002 Saito ........................... 455/260
2003/0078022 A1 * 4/2003 Cai .............................. 455/260
2003/0171106 A1 * 9/2003 Dunworth et al. .......... 455/262
2005/0266817 A1 * 12/2005 Welland et al. ............. 455/260

* cited by examiner

*Primary Examiner*—Aung Moe
(74) *Attorney, Agent, or Firm*—Garlick Harrison & Markison; Timothy W. Markison (57) ABSTRACT

A method for calibrating a phase locked loop (PLL) includes an open loop test and a closed loop test. The open loop test includes providing an optimal control input to a controlled oscillator (CO) of the PLL; determining rate of output oscillation of the CO based on the optimal control input; comparing the rate of the output oscillation with rate of an optimal output oscillation; and when the comparing the rate of the output oscillation with rate of the optimal output oscillation is unfavorable, adjusting an oscillation point of the CO until the comparing is favorable to produce an open-loop adjusted CO oscillation point. The close loop test includes determining a closed-loop input control level of the CO at the open-loop adjusted CO oscillation point; comparing the closed-loop input control level with the optimal control input; and when the comparing the closed-loop input control level with the optimal control input is not favorable, adjusting the open-loop adjusted CO oscillation point until the comparing is favorable.

21 Claims, 6 Drawing Sheets

FIG. 3
LO module 74

FIG. 4
LO module 74

PHASE LOCKED LOOP CALIBRATION

BACKGROUND OF THE INVENTION

1. Technical Field of the Invention

This invention relates generally to communication systems and, more particularly, to radio receivers and transmitters used within such communication systems.

2. Description of Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

As is known, phase locked loops (PLL) are commonly used in integrated wireless transceivers as components for frequency generation and modulation due to their high level of integration and ability to operate over a wide range of frequencies. As is further known, two basic PLL topologies exist, usually referred to as "type 1" and "type 2", respectively. The general structure is common to both types of PLLs, namely a phase detector, a lowpass filter (LPF), a voltage controlled oscillator (VCO) and a feedback path. The phase detector serves as an "error amplifier" in the feedback loop, thereby minimizing the phase difference between the input reference signal and the feedback signal. The loop is considered "locked" if this phase difference is constant with time.

In "type 1" PLLs, the phase detector generates square voltage pulses whose duration is proportional to the phase error. These voltage pulses are filtered by the LPF to generate a smooth VCO control voltage whose amplitude is proportional to the phase error. The VCO responds to the change in control voltage by increasing or decreasing its oscillation frequency. The feedback action of the PLL then causes the VCO to lock to the desired operating frequency.

In "type 2" PLLs, also known as "charge pump based PLLs", the topology includes a phase and frequency detector, a charge pump, a loop filter, a voltage controlled oscillator (VCO), and a feedback loop path. The phase and frequency detector compares the phase and frequency of a reference signal with the phase and frequency of a feedback signal (e.g., the output oscillation produced by the VCO fed back to the phase and frequency detector via the feedback loop). If the phase and/or frequency of the reference signal leads the phase and/or frequency of the feedback signal (which occurs when the output oscillation is below the desired rate), the phase and frequency detector generates an up signal. In response to the up signal, the charge pump increases the positive current it outputs, which, when filtered by the loop filter, increases the control voltage input of the VCO. With an increase in the control voltage, the VCO increases the rate of the output oscillation. If the phase and/or frequency of the reference signal lags the phase and/or frequency of the feedback signal (which occurs when the output oscillation is above the desired rate), the phase and frequency detector generates a down signal. In response to the down signal, the charge pump increases the negative current it outputs, which, when filtered by the loop filter, decreases the control voltage input of the VCO. With a decrease of the control voltage input, the VCO decreases the rate of the output oscillation.

In an ideal PLL, the VCO operates linearly, which can be mathematically expressed as:

$$\theta_{out}(t) = K_{VCO} \int V_{cntl}(t) dt,$$

where $K_{VCO}$ is the gain (specified in MHz/volt, for example) of the VCO, $\theta_{out}$ is the output oscillation of the VCO, and $V_{cntl}$ is in the input control voltage of the VCO. Based on this ideal model, when the PLL settles to a desired output frequency (i.e., the output of the VCO), the input control voltage of the VCO assumes a constant value. When used as a modulator, the control voltage varies around this constant value according to the desired modulation pattern, thereby generating frequency modulation. It follows directly from the above equation that the modulated signal is proportional to the change in control voltage with a proportionality constant equal to Kvco. In practice, however, the VCO does not operate linearly since the gain of the VCO (i.e., Kvco) is not a constant, but varies with integrated circuit fabrication process, PLL frequency band, control voltage amplitude, and temperature. For instance, for a PLL that has a wide frequency range of operation, the gain of the VCO may vary from its nominal design value by as much as +/−50%. Since Kvco is a key parameter governing the dynamic behavior of the PLL, when If the PLL is used as a modulator (e.g., in a translational loop), the large variation of VCO gain may produces prohibitively large modulation errors.

One solution to reduce the adverse affects of the variations of the VCO gain is to design the baseband processor to account for the VCO gain variations. This solution, however, relies on an assumed VCO gain variation, not an actual variation, and may therefore not be precise. As such, this solution is of limited benefit. Another solution is to limit the VCO gain to a small value. This, however, reduces the dynamic range of the PLL such that, if an appreciable offset exists from ideal operation of the PLL.

Therefore, a need exists for a method and apparatus to calibrate the PLL dynamics to approach ideal operation of a PLL.

BRIEF SUMMARY OF THE INVENTION

The phase locked loop calibration of the present invention substantially meets these needs and others. In one embodiment, a method for calibrating a phase locked loop (PLL) includes an open loop test and a closed loop test. The open loop test begins by providing an optimal control input to a controlled oscillator (CO) of the PLL. The open loop test continues by determining rate of output oscillation of the CO based on the optimal control input. The open loop test continues by comparing the rate of the output oscillation with rate of an optimal output oscillation. The open loop test continues when the comparing the rate of the output oscillation with rate of the optimal output oscillation is unfavorable by adjusting an oscillation point of the CO until the comparing the rate of the output oscillation with rate of an optimal output oscillation is favorable to produce an open-loop adjusted CO oscillation point. When the open loop test is complete, the close loop test begins by determining a closed-loop input control level of the CO at the open-loop adjusted CO oscillation point. The closed loop test continues by comparing the closed-loop input control level with the optimal control input. The closed loop test continues when the comparing the closed-loop input control level with the optimal control input is not favorable by adjusting the open-loop adjusted CO oscillation point until the comparing the closed-loop input control level with the optimal control input is favorable. With such a method, a PLL may be implemented have a small CO gain such PLL approaches ideal operation, which reduces noise levels within the PLL.

DETAILED DESCRIPTION OF THE INVENTION

Figure 1:
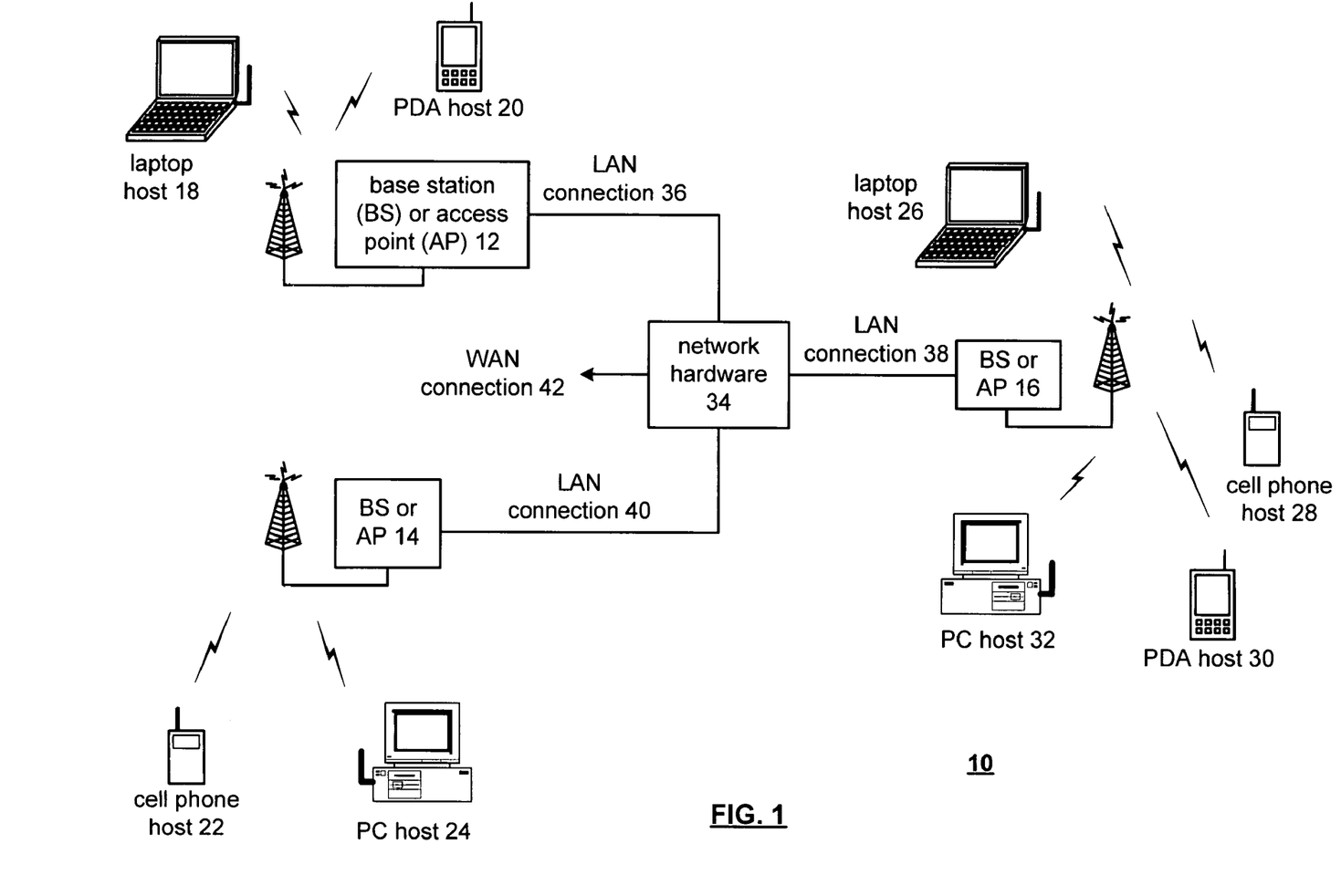
FIG. 1 is a schematic block diagram of a wireless communication system in accordance with an embodiment of the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
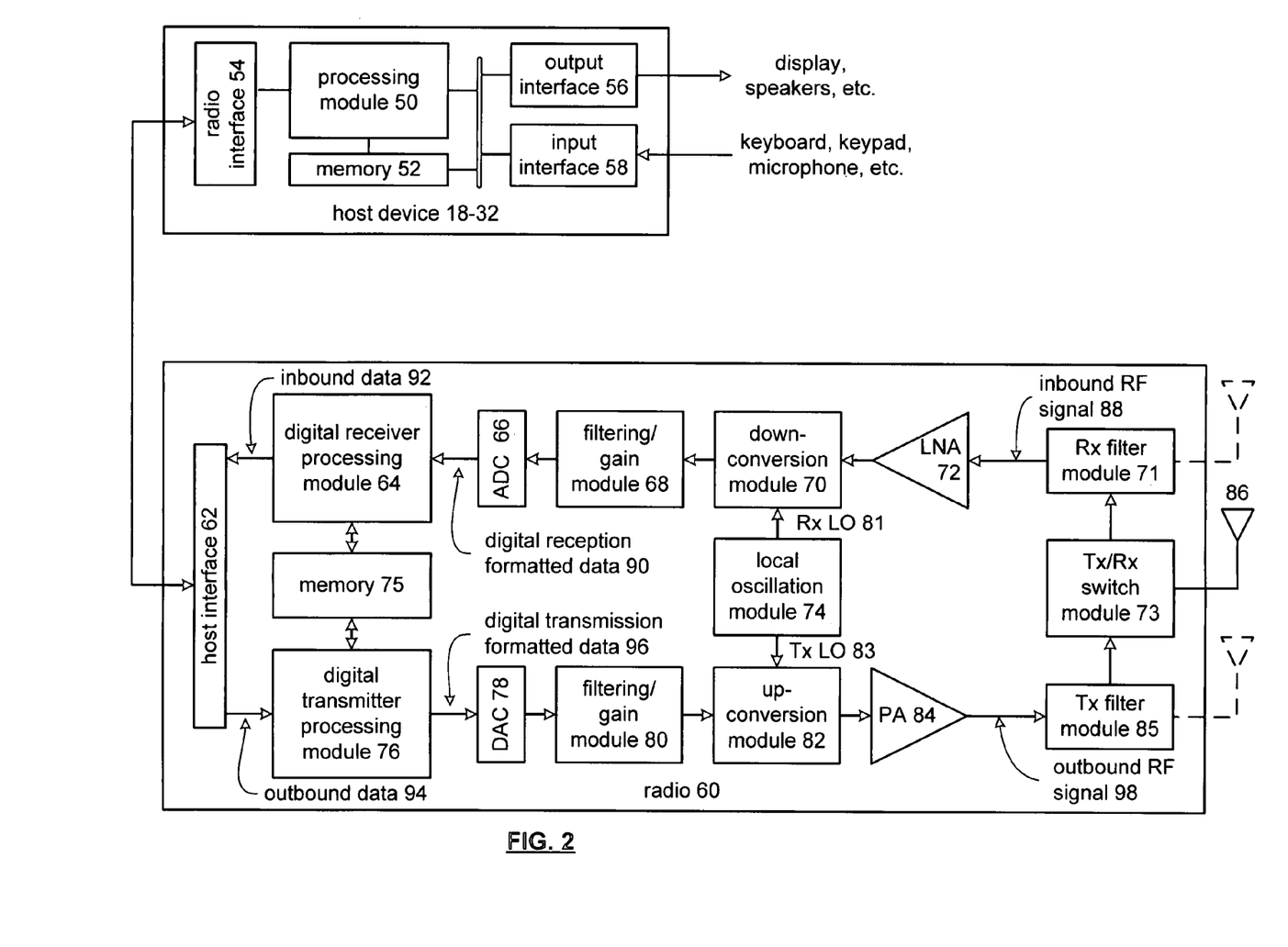
FIG. 2 is a schematic block diagram of a wireless communication device in accordance with an embodiment of the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
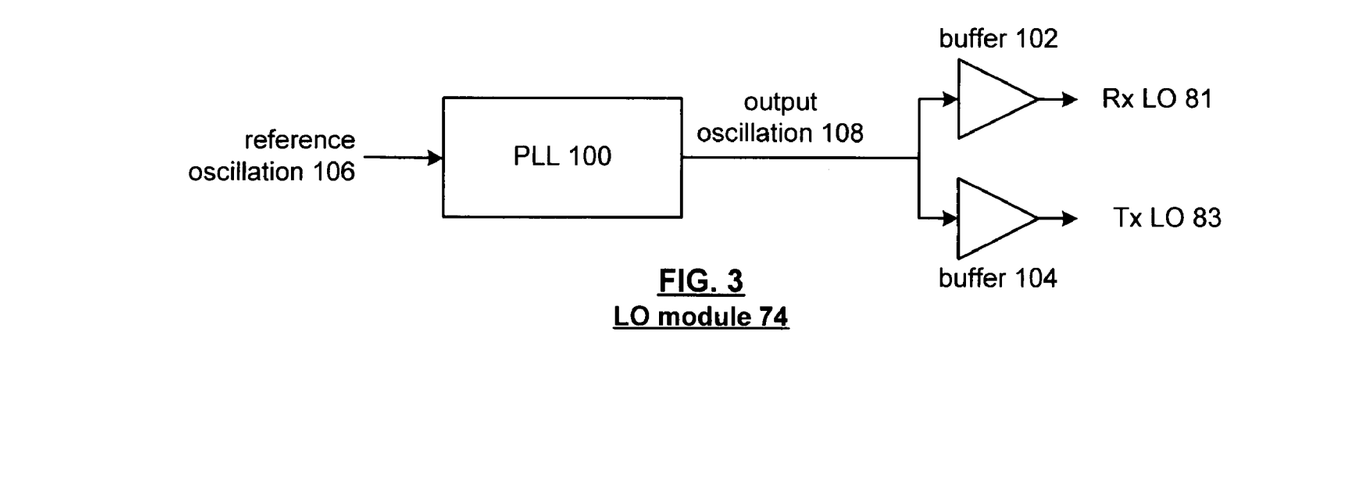
FIG. 3 is a schematic block diagram of a local oscillation generator in accordance with an embodiment of the present invention.

FIG. 3 is a schematic block diagram of an embodiment of the local oscillation module 74. In this embodiment, the local oscillation module 74 includes a phase locked loop 100 and buffers 102 and 104. The phase locked loop produces an output oscillation 108 based on reference oscillation 106. The functionality of the phase locked loop 100 will be described in greater detail with reference to FIGS. 6–12.

Buffers 102 and 104 buffer the output oscillation 108 to produce the receiver local oscillation 81 and transmitter local oscillation 83, respectively. As one of average skill in the art will appreciate, if an in-phase and quadrature local oscillation is needed for the receiver local oscillation 81 and/or for the transmit local oscillation 83, the output oscillation 108 would be shifted by a 90° phase shift module and subsequently buffered via another buffer.

Figure 4:
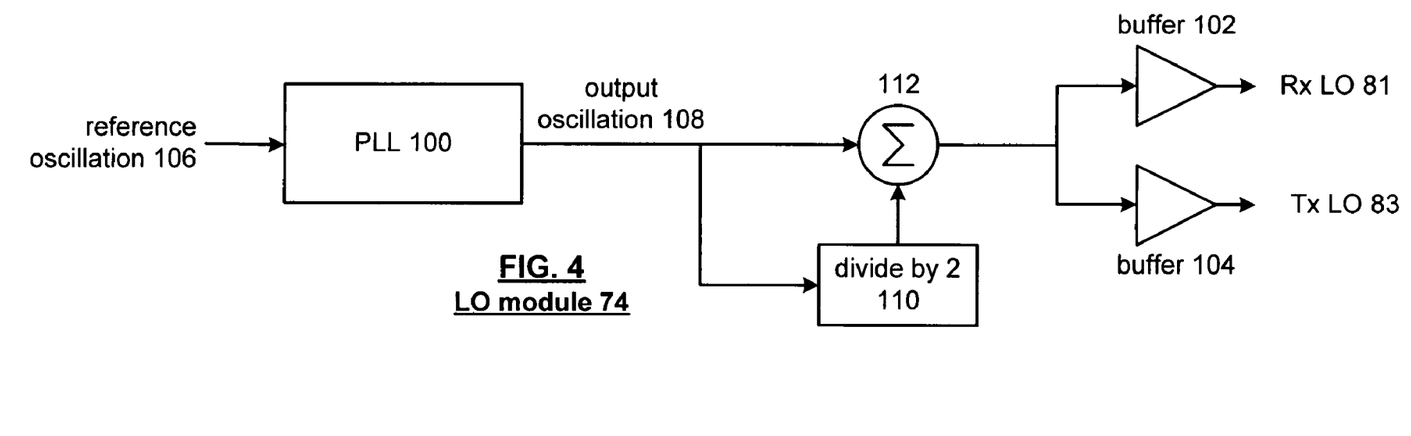
FIG. 4 is a schematic block diagram of a local oscillation generator in accordance with another embodiment of the present invention.

FIG. 4 is a schematic block diagram of another embodiment of the local oscillation module 74. In this embodiment, the local oscillation module 74 includes a phase locked loop 100, a summation module 112, a divide-by-two module 110 and buffers 102 and 104. In this embodiment, the output oscillation 108 is approximately two-thirds of the desired rate of local oscillation 81 or 83. Dividing the output oscillation 108 by two and then summing it via summer 112, the desired rate of the local oscillation is achieved. Buffers 102 and 104 buffer the summed output oscillation to produce the receive local oscillation 81 and transmit local oscillation 83, respectively. As one of average skill in the art will appreciate, an in-phase and quadrature component of the local oscillations 81 and 83 may be obtained by phase shifting, by 90°, the local oscillation 81 and/or 83.

Figure 5:
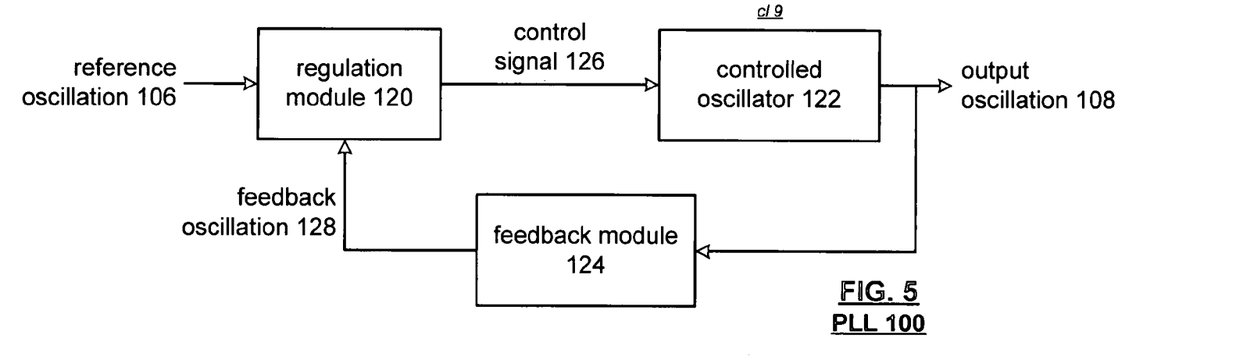
FIG. 5 is a schematic block diagram of a phase locked loop in accordance with an embodiment of the present invention.

FIG. 5 is a schematic block diagram of phase locked loop 100 that includes a regulation module 120, a controlled oscillator 122 and a feedback module 124. The regulation module 120 controls the calibration of phase locked loop 100 during a set-up mode and also produces a control signal 126 during normal operation. The calibration mode will be described in greater detail with reference to FIGS. 6–12.

In normal operation, the regulation module 120 receives a reference oscillation 126 and the feedback oscillation 128. Based on a phase and/or frequency difference between the reference oscillation 106 and feedback oscillation 128, the regulation module 120 produces a control signal 126. The controlled oscillator 122, which may be a voltage controlled oscillator, digital oscillator, and/or current controlled oscillator, produces the output oscillation 108 based on control signal 126. The feedback module 124 divides the output oscillation by an integer and/or fractional-N divider value to produce the feedback oscillation 128.

As one of average skill in the art will appreciate, the phase locked loop 100 may be used as illustrated in FIGS. 3 and 4 as part of a local oscillation. Additionally, the phase locked loop may be used as part of a modulator in the transmitter section such that the output oscillation 108 corresponds to the RF signal being produced by the transmit section and the reference oscillation 106 corresponds to the digital data that is being modulated.

Figure 6:
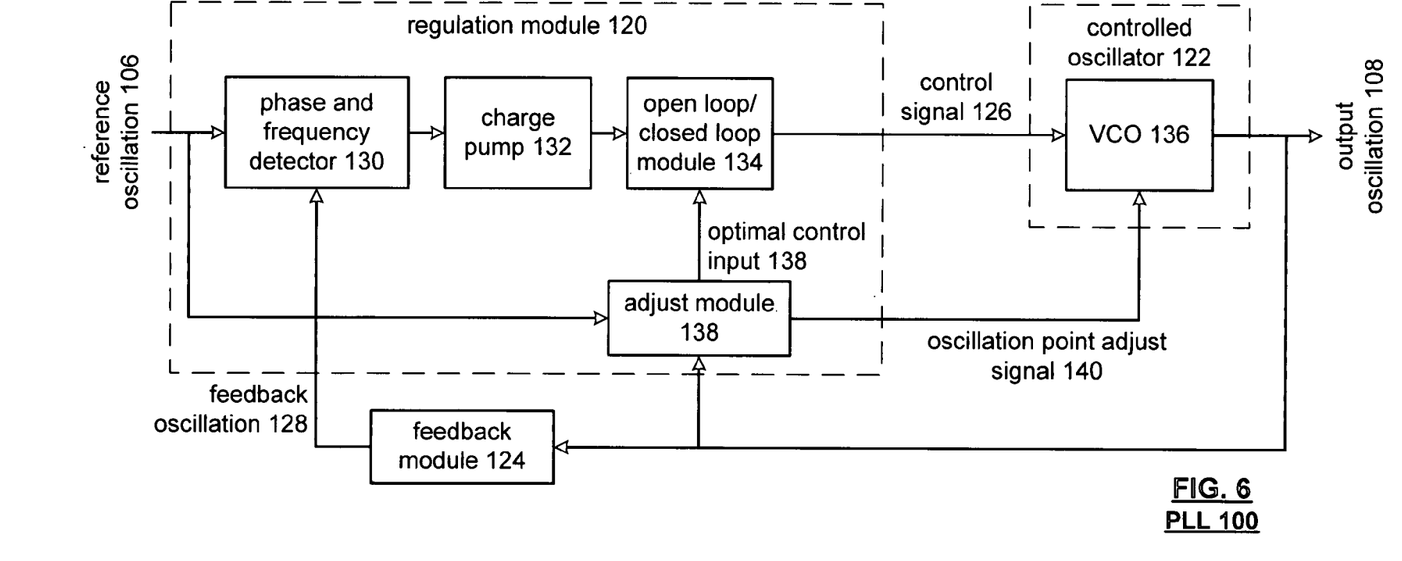
FIG. 6 is a schematic block diagram of a phase locked loop in accordance with another embodiment of the present invention.

FIG. 6 is a schematic block diagram of an alternate embodiment of phase locked loop 100. In this embodiment, the regulation module 120 includes a phase and frequency detector 130, a charge pump 132 (which includes a loop filter), an open loop/closed loop module 134, and an adjust module 138. The controlled oscillator 122 is implemented via a voltage control oscillator (VCO) 136.

Figures 11, 12:
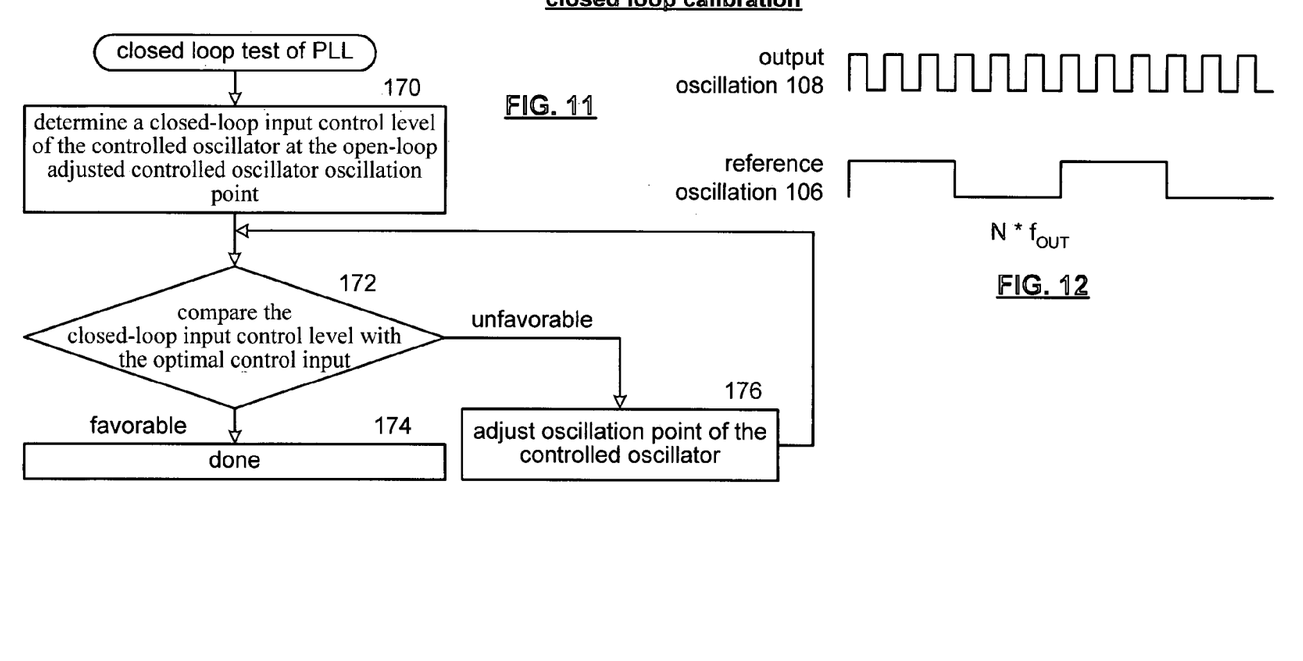
FIG. 11 is a logic diagram of a method for closed loop calibration of a phase locked loop in accordance with the present invention.
FIG. 12 is a diagram of an output oscillation and a reference oscillation in accordance with the present invention.

The open/closed loop module 134 switches between providing the output of charge pump 132 as the control signal 126 to the VCO 136 and providing the optimal control input 138 from the adjust module 138 as control signal 126 to the VCO 136. In open loop mode, the optimal control input 138 is set at the nominal control voltage for VCO 136. The voltage controlled oscillator 136 produces an output oscillation 108 based on the optimal control input 138. The adjust module 138 compares the rate of the output oscillation 108 with the rate of the reference oscillation 106. For instance, if the feedback module 110 is a divide-by-ten module and the reference oscillation is 10 MHz, the output oscillation 108 should be 100 MHz if the VCO 136 is operating in an ideal or near ideal manner. If the output oscillation rate substantially matches the rate of the reference oscillation times the divider value, then, with respect to an open loop test, the VCO 136 is properly calibrated. If the rates do not substantially match, the output oscillation point of the VCO 136 is adjusted via oscillation point adjust signal 140 and the open loop test is repeated. The open loop test is continually repeated until the rate of the output oscillation 108 substantially matches the rate of the reference oscillation 106 times the divider value as shown in FIG. 12.

Once the open loop test has been performed, the closed loop module 134 closes the loop such that the output of charge pump 132 provides the control signal 126 to VCO 136. In the closed loop test, the output adjust module 138 again compares the rate of the output oscillation 108 with the rate of the reference oscillation 106 times the divider value. If the rates substantially match, the VCO is operating in a near ideal mode. If not, the output adjust module 138 adjusts the oscillation point of the VCO 136 via the oscillation point adjust signal 140. The closed loop test is completed when the rate of the output oscillation 108 substantially matches the rate of the reference oscillation 106 times the divider value as shown in FIG. 12.

In normal operation, the opened loop/closed loop module 134 is closed and the adjust module 138 is inactive. In this mode, the phase and frequency detector 130 produces a different signal based on phase and/or frequency difference between the reference oscillation 106 and feedback oscillation 128. The charge pump 132 converts the difference signal into a current signal that may be supplied to a loop filter, which is not shown, wherein the output of the loop filter produces the control signal 126. The VCO 136 produces the output oscillation based on control signal 126 and the feedback module 124 divides the rate of the output oscillation 108 by a divider value to produce the feedback oscillation 128.

Figures 7, 8, 9:
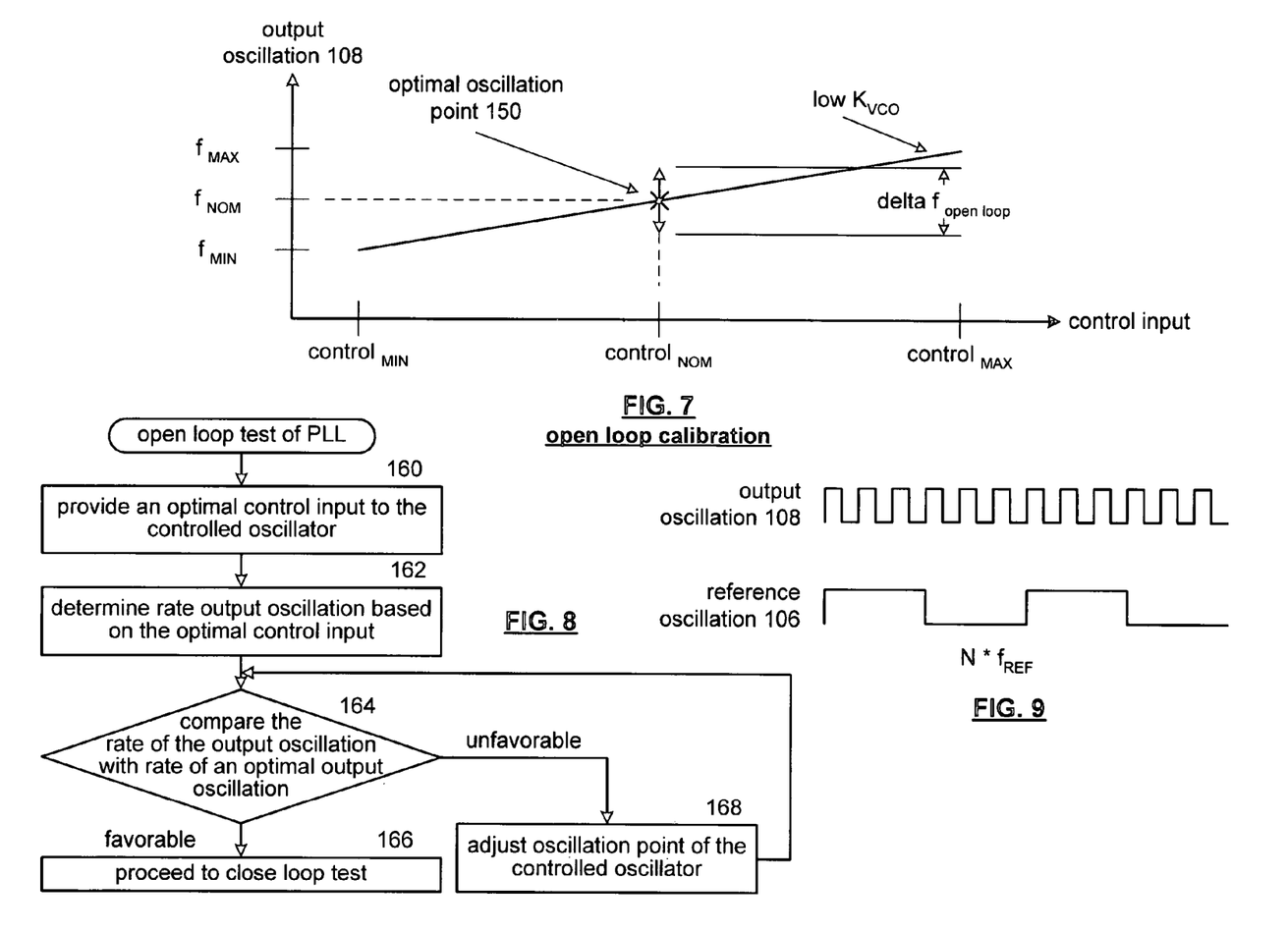
FIG. 7 is a diagram of an open loop calibration of a phase locked loop in accordance with the present invention.
FIG. 8 is a logic diagram of a method for open loop calibration of a phase locked loop in accordance with the present invention.
FIG. 9 is a timing diagram of an output oscillation and a reference oscillation of a phase locked loop during open loop calibration in accordance with the present invention.

FIG. 7 illustrates a graphical representation of the opened loop calibration of the phase locked loop. In this illustration, the gain of a voltage controlled oscillator ($K_{VCO}$) is low (i.e., the slope of $K_{VCO}$ is small). By maintaining a low VCO gain, the phase locked loop introduces less noise into the system. With reduced noise in the system, the signal-to-noise ratio of the system is enhanced.

To facilitate the opened loop calibration test, the adjust module 138 injects the optimal control input 138, which corresponds to the control nominal input value (control-$_{NOM}$). Typically, the nominal control input is halfway between the control min and control max values. With the control input being fixed to the control nominal value, the output oscillation of the VCO is tested. In ideal operation, the output oscillation will occur at the $F_{NOM}$ value, which corresponds to the halfway point between its minimum output oscillation and maximum output oscillation. This corresponds to the optimal oscillation point 150. If the VCO is not operating in an ideal manner, i.e., it includes a delta frequency offset (delta $f_{OPEN\ LOOP}$), the operating parameters of the VCO are adjusted. For instance, if the VCO is implemented utilizing inductors and capacitors, the capacitance value and/or inductance value may be adjusted to tune the oscillation of the VCO. The tuning of the VCO may be done in incremental steps and/or based on the amount of frequency offset from the nominal value to tune the VCO to operate, in the open loop mode, at the optimal oscillation point 150.

FIG. 8 illustrates a logic diagram for the open loop testing of the phase locked loop. The processing begins at Step 160 where an optimal control input is provided to the controlled oscillator. The process then proceeds to Step 162 where the rate of the output oscillation is determined based on the optimal control input. The process then proceeds to Step 164 where the rate of the output oscillation is compared with the rate of the optimal output oscillation. The optimal output oscillation corresponds to the divider value times the reference oscillation. If the comparison is favorable, the process proceeds to Step 166 where the calibration continues with the closed loop testing. If the comparison was unfavorable, the process proceeds to Step 168 where the oscillation point of the controlled oscillator is adjusted. The adjusting of the oscillation point may be done in an iterative manner where the oscillating elements of the VCO are adjusted in known steps. For example, if a VCO is implemented utilizing inductor-capacitor circuitry, the capacitor value may be stepped up or down to adjust the oscillating point. Such an iterative adjusting may be done utilizing a binary search process to tune the resonant components of a VCO. Alternatively, an offset may be determined between the rate of the output oscillation with the rate of the optimal output oscillation. Based on the offset, the oscillation point may be adjusted.

FIG. 9 illustrates a graphical representation for comparing the rate of the output oscillation with the rate of the optimal output oscillation. As shown, the output oscillation 108 has a particular frequency that is greater than the rate of the reference oscillation 106. The optimal output oscillation corresponds to the divider value N times the reference oscillation ($f_{ref}$). Thus, a counting process may be used to determine the comparison. For example, if the divider value N is 10, for every 10 cycles of the reference oscillation 106, 100 cycles of the output oscillation 108 should occur. If more or less than 100 cycles of the output oscillation occur, the output oscillation 108 does not match the optimum output oscillation. Accordingly, the components of the controlled oscillation may be adjusted to acheive the desired oscillation point.

Figure 10:
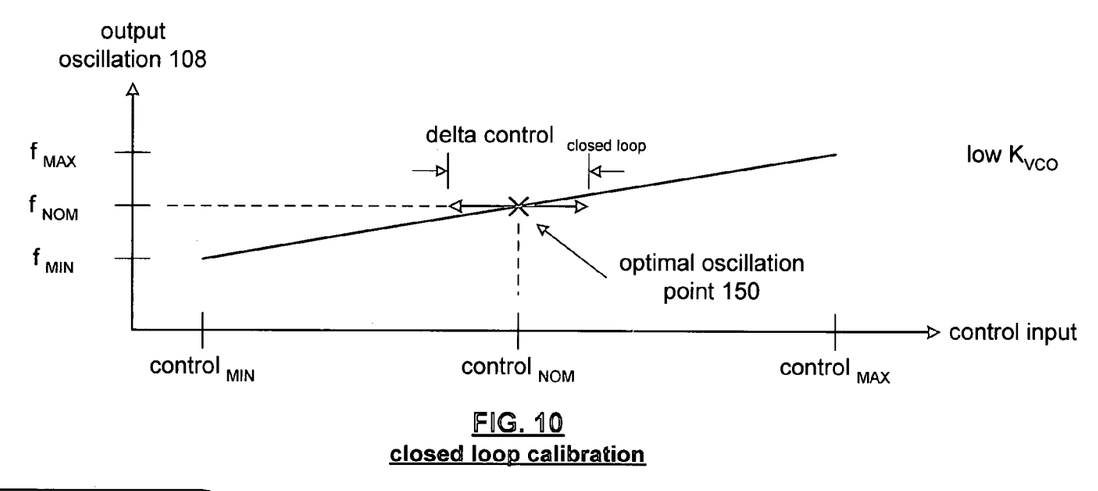
FIG. 10 is a diagram of a closed loop calibration of a phase locked loop in accordance with the present invention.

FIG. 10 illustrates a graphical representation of the closed loop calibration of the phase locked loop. In this instance, since the VCO has been tuned in the opened loop test to produce the nominal output frequency at the nominal control input, the control voltage will vary from the nominal control input if the VCO is not tuned to ideal operating conditions. If the VCO is not operating in an ideal manner, i.e., it includes a delta control offset (delta control $_{CLOSED\ LOOP}$), the operating parameters of the VCO are adjusted. For instance, if the VCO is implemented utilizing inductors and capacitors, the capacitance value and/or inductance value may be adjusted to tune the oscillation of the VCO. The tuning of the VCO may be done in incremental steps and/or based on the amount of control voltage offset from the nominal value to tune the VCO to operate, in the closed loop mode, at the optimal oscillation point 150.

FIG. 11 illustrates the process for performing the closed loop test of the phase locked loop. The process begins at Step 170 where a closed loop input control level of the controlled oscillation is determined at the opened loop adjust controlled oscillator oscillation point. This corresponds, with reference to FIG. 10, determining the value of the controlled input of the phase locked loop in the closed loop mode which produces the nominal output frequency. The process then proceeds to Step 172 where the closed loop input control level is compared with the optimal control input. If the comparison is favorable, the calibration process is complete as illustrated at Step 174. If the comparison was not favorable, the process proceeds to Step 176 where the oscillation point of the oscillator is adjusted and the comparison is repeated at Step 172. As an alternative to an iterative process, an offset may be determined from the closed loop input control voltage with the optimal control voltage to determine the amount of adjustment needed on the oscillation point.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a calibration process for a low noise phase locked loop, where the low noise is achieved by maintaining a low VCO, or controlled oscillator gain. As one of average skill in the art will appreciate, other embodiments may be derived from the teaching of the present invention without deviating from the scope of the claims.

What is claimed is:

1. A method for calibrating a phase locked loop (PLL), the method comprises:
   performing an open loop test on the PLL by:
      providing an optimal control input to a controlled oscillator (CO) of the PLL;
      determining rate of output oscillation of the CO based on the optimal control input;
      comparing the rate of the output oscillation with rate of an optimal output oscillation;
      when the comparing the rate of the output oscillation with rate of the optimal output oscillation is unfavorable, adjusting an oscillation point of the CO until the comparing the rate of the output oscillation with rate of an optimal output oscillation is favorable to produce an open-loop adjusted CO oscillation point; and
   performing a closed loop test of the PLL by:

determining a closed-loop input control level of the CO at the open-loop adjusted CO oscillation point;

comparing the closed-loop input control level with the optimal control input; and when the comparing the closed-loop input control level with the optimal control input is not favorable, adjusting the open-loop adjusted CO oscillation point until the comparing the closed-loop input control level with the optimal control input is favorable.

2. The method of claim 1, wherein the controlled oscillator comprises at least one of a voltage controlled oscillator (VCO), a current controlled oscillator (ICO) and a digital oscillator.

3. The method of claim 1, wherein each of the adjusting an oscillation point of the CO until the comparing the rate of the output oscillation with rate of an optimal output oscillation is favorable to produce an open-loop adjusted CO oscillation point and the adjusting the open-loop adjusted CO oscillation point until the comparing the closed-loop input control level with the optimal control input is favorable further comprises:

adjusting, for each iteration of comparing and adjusting, resonant tuning of the controlled oscillator, (for open loop and closed loop) (e.g., by adjusting the cap of an LC VCO).

4. The method of claim 3 further comprises:

utilizing a binary search for the adjusting of the resonant tuning.

5. The method of claim 4, wherein the comparing the rate of the output oscillation with rate of the optimal output oscillation comprises:

counting cycles of the output oscillation to produce an output oscillation count;

comparing the output oscillation count with a reference count that is based on a divider value times a predetermined number of cycles of the references oscillation;

when the output oscillation count is within a window of count vales of the reference count, indication that the comparison was favorable.

6. The method of claim 5 further comprises:

when the output oscillation count matches the reference count, ending the iterative comparing and adjusting; and utilizing the adjusted resonant tuning of the controlled oscillator.

7. The method of claim 1, wherein the adjusting the oscillation point of the CO further comprises:

determining an offset between rate of the output oscillation with rate of an optimal output oscillation; and adjusting the oscillation point of the CO based on the offset.

8. A phase locked loop (PLL) comprises:

regulation module operably coupled to generate a control signal based on at least one of a phase difference and a frequency difference between a reference oscillation and a feedback oscillation;

controlled oscillator operably coupled to produce an output oscillation based on the control signal; and feedback module operably coupled to produce the feedback oscillation based on a divider value and the output oscillation, wherein the regulation module functions to calibrate the PLL by:

performing an open loop test on the PLL by:

providing an optimal control input to the controlled oscillator;

determining rate of output oscillation of the controlled oscillator based on the optimal control input;

comparing the rate of the output oscillation with rate of an optimal output oscillation;

when the comparing the rate of the output oscillation with rate of the optimal output oscillation is unfavorable, adjusting an oscillation point of the controlled oscillator until the comparing the rate of the output oscillation with rate of an optimal output oscillation is favorable to produce an open-loop adjusted controlled oscillator oscillation point; and performing a closed loop test of the PLL by:

determining a closed-loop input control level of the controlled oscillator at the open-loop adjusted controlled oscillator oscillation point;

comparing the closed-loop input control level with the optimal control input; and when the comparing the closed-loop input control level with the optimal control input is not favorable, adjusting the open-loop adjusted controlled oscillator oscillation point until the comparing the closed-loop input control level with the optimal control input is favorable.

9. The PLL of claim 8, wherein the controlled oscillator comprises at least one of a voltage controlled oscillator (VCO), a current controlled oscillator (ICO) and a digital oscillator.

10. The PLL of claim 8, wherein each of the adjusting an oscillation point of the CO until the comparing the rate of the output oscillation with rate of an optimal output oscillation is favorable to produce an open-loop adjusted CO oscillation point and the adjusting the open-loop adjusted CO oscillation point until the comparing the closed-loop input control level with the optimal control input is favorable further comprises:

adjusting, for each iteration of comparing and adjusting, resonant tuning of the controlled oscillator, (for open loop and closed loop) (e.g., by adjusting the cap of an LC VCO).

11. The PLL of claim 10, wherein the regulation module further functions to:

utilize a binary search for the adjusting of the resonant tuning.

12. The PLL of claim 11, wherein the comparing the rate of the output oscillation with rate of the optimal output oscillation comprises:

counting cycles of the output oscillation to produce an output oscillation count;

comparing the output oscillation count with a reference count that is based on a divider value times a predetermined number of cycles of the references oscillation;

when the output oscillation count is within a window of count vales of the reference count, indication that the comparison was favorable.

13. The PLL of claim 12, wherein the regulation module further functions to:

when the output oscillation count matches the reference count, end the iterative comparing and adjusting; and utilize the adjusted resonant tuning of the controlled oscillator.

14. The PLL of claim 8, wherein the adjusting the oscillation point of the CO further comprises:

determining an offset between rate of the output oscillation with rate of an optimal output oscillation; and adjusting the oscillation point of the CO based on the offset.

15. A radio frequency integrated circuit (RFIC) comprises:
a transmitter section operably coupled to convert outbound data into outbound radio frequency (RF) signals based on a transmitter local oscillation;
a receiver section operably coupled to convert inbound RF signals into inbound data based on a receiver local oscillation; and
a local oscillation generator operably coupled to produce the transmitter local oscillation and the receiver local oscillation, wherein the local oscillation generator includes:
  regulation module operably coupled to generate a control signal based on at least one of a phase difference and a frequency difference between a reference oscillation and a feedback oscillation;
  controlled oscillator operably coupled to produce an output oscillation based on the control signal, wherein the transmitter local oscillation and the receiver local oscillation are derived from the output oscillation; and
  feedback module operably coupled to produce the feedback oscillation based on a divider value and the output oscillation, wherein the regulation module functions to calibrate the PLL by:
    performing an open loop test on the PLL by:
      providing an optimal control input to the controlled oscillator;
      determining rate of output oscillation of the controlled oscillator based on the optimal control input;
      comparing the rate of the output oscillation with rate of an optimal output oscillation;
      when the comparing the rate of the output oscillation with rate of the optimal output oscillation is unfavorable, adjusting an oscillation point of the controlled oscillator until the comparing the rate of the output oscillation with rate of an optimal output oscillation is favorable to produce an open-loop adjusted controlled oscillator oscillation point; and
    performing a closed loop test of the PLL by:
      determining a closed-loop input control level of the controlled oscillator at the open-loop adjusted controlled oscillator oscillation point;
      comparing the closed-loop input control level with the optimal control input; and
      when the comparing the closed-loop input control level with the optimal control input is not favorable, adjusting the open-loop adjusted controlled oscillator oscillation point until the comparing the closed-loop input control level with the optimal control input is favorable.

16. The RFIC of claim 15, wherein the controlled oscillator comprises at least one of a voltage controlled oscillator (VCO), a current controlled oscillator (ICO) and a digital oscillator.

17. The RFIC of claim 15, wherein each of the adjusting an oscillation point of the CO until the comparing the rate of the output oscillation with rate of an optimal output oscillation is favorable to produce an open-loop adjusted CO oscillation point and the adjusting the open-loop adjusted CO oscillation point until the comparing the closed-loop input control level with the optimal control input is favorable further comprises:
adjusting, for each iteration of comparing and adjusting, resonant tuning of the controlled oscillator.

18. The RFIC of claim 17, wherein the regulation module further functions to:
utilize a binary search for the adjusting of the resonant tuning.

19. The RFIC of claim 18, wherein the comparing the rate of the output oscillation with rate of the optimal output oscillation comprises:
counting cycles of the output oscillation to produce an output oscillation count;
comparing the output oscillation count with a reference count that is based on a divider value times a predetermined number of cycles of the references oscillation;
when the output oscillation count is within a window of count vales of the reference count, indication that the comparison was favorable.

20. The RFIC of claim 19, wherein the regulation module further functions to:
when the output oscillation count matches the reference count, end the iterative comparing and adjusting; and
utilize the adjusted resonant tuning of the controlled oscillator.

21. The RFIC of claim 15, wherein the adjusting the oscillation point of the CO further comprises:
determining an offset between rate of the output oscillation with rate of an optimal output oscillation; and
adjusting the oscillation point of the CO based on the offset.

* * * * *